(12) United States Patent
Kendall et al.

(10) Patent No.: US 6,216,180 B1
(45) Date of Patent: Apr. 10, 2001

(54) METHOD AND APPARATUS FOR A NONVOLATILE MEMORY INTERFACE FOR BURST READ OPERATIONS

(75) Inventors: Terry L. Kendall, Diamond Springs; Kenneth G. McKee, Shingle Springs, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/083,578

(22) Filed: May 21, 1998

(51) Int. Cl.[7] .................................................. G06F 13/00
(52) U.S. Cl. .................. 710/35; 710/7; 710/20; 365/203; 365/230
(58) Field of Search .................... 710/35, 20, 7; 711/111; 365/203, 230

(56) References Cited

U.S. PATENT DOCUMENTS

| | | | |
|---|---|---|---|
| 5,305,281 | * | 4/1994 | Lubeck ............................ 365/230.04 |
| 5,396,608 | * | 3/1995 | Garde .................................. 711/200 |
| 5,410,680 | * | 4/1995 | Challa et al. ........................ 395/500 |
| 5,715,421 | * | 2/1998 | Akiyama et al. .................... 365/203 |
| 5,829,016 | * | 10/1998 | Sharma et al. ...................... 711/111 |
| 5,848,023 | * | 12/1998 | Kato et al. ...................... 365/230.09 |
| 5,896,551 | * | 4/1999 | Williams et al. .................... 711/150 |
| 5,903,496 | * | 5/1999 | Kendall et al. ................. 365/185.12 |
| 5,973,961 | * | 10/1999 | Park et al. ...................... 365/185.13 |

FOREIGN PATENT DOCUMENTS

362251943 * 11/1997 (JP) .

* cited by examiner

*Primary Examiner*—Thomas Lee
*Assistant Examiner*—Tammara Peyton
(74) *Attorney, Agent, or Firm*—Blakely, Sokoloff, Taylor & Zafman LLP

(57) ABSTRACT

An improved method and apparatus for performing burst read operations in a nonvolatile memory includes a burst read device coupled to the nonvolatile memory, wherein the burst read device senses a page of data from the nonvolatile memory, latches the page of data, synchronously reads the data one word at a time, and senses a next page of data concurrently with the synchronous reading.

30 Claims, 4 Drawing Sheets

METHOD AND APPARATUS FOR A NONVOLATILE MEMORY INTERFACE FOR BURST READ OPERATIONS

FIELD OF THE INVENTION

The present invention pertains to the field of memory devices. More particularly, this invention relates to the art of sequential burst read operations in nonvolatile memory.

BACKGROUND OF THE INVENTION

Advances in computer technology have led to increasingly faster microprocessors. These faster microprocessors are capable of running increasingly larger software applications, which require faster, higher capacity memory devices. At the same time, the trend in computer technology is toward smaller, lighter, and less expensive computers. When selecting a memory device, computer designers often have to trade speed for size, cost, or storage density. A wide variety of memory devices, each with certain strengths and weaknesses, is available. Among them, flash memory has proven to be particularly useful.

Flash memory is a nonvolatile rewritable memory. The read characteristics for a typical flash memory are similar to the read characteristics for other nonvolatile memories, such as readonly memory (ROM) devices. For example, a read operation for a typical high speed flash memory may take on the order of 80 nanoseconds (ns), which is comparable to many ROMs. Unlike ROM, however, flash memory can be erased and rewritten, although write and erase operations are significantly slower than read operations. For example, an erase operation may take on the order of one second, and a write operation may take on the order of 10 microseconds.

Even though the write and erase operations in flash memory are comparatively long, the nonvolatility and rewritability of flash memory are desirable features for a number of applications. For example, using flash to store a computer System's Basic Input Output system (BIOS) and boot code permits the user to update the BIOS without having to replace the storage medium. Flash memory is also useful for storing "ROM-able" (e.g. read only), or "read mostly" files. That is, since flash memory read operations are much faster than write and erase operations, flash is particularly useful for storing information that is primarily read. For instance, operating system and application files can be divided up into ROM-able and read/write portions. The ROM-able portions can be executed directly from flash memory, rather than waiting for the files to be loaded from a hard disk to random access memory (RAM).

Even in ROM-able, or infrequently updated applications, flash presents certain challenges. For instance, a flash memory read operation is typically asynchronous, meaning that data is read out of flash memory a set time after an address is provided. In other words, data is not provided in response to a clock signal. So, if the clock rate of a high speed bus connected to a flash memory is running faster than the access time of the flash memory, every memory access could introduce wait states on the high speed bus. Thus, a burst read operation might result in a wait state for each address read.

One approach to this problem is to perform a page read. Instead of reading one byte or word of data for each address, a page of data is read at a time. Each page of data includes a number of words of data. The words of data are buffered and provided to the bus synchronously, one word at a time. By reading data a page at a time, wait states are only incurred once every page of data rather than once every word or byte of data. When a large block of contiguous data is read from flash memory in a burst, however, the accumulated wait states can have a significant performance impact, even if wait states are incurred only once every page of data.

SUMMARY OF THE INVENTION

An improved method and apparatus for performing burst read operations in a nonvolatile memory includes a burst read device coupled to the nonvolatile memory, wherein the burst read device senses a page of data from the nonvolatile memory, latches the page of data, synchronously reads the data one word at a time, and senses a next page of data concurrently with the synchronous reading.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following description, numerous specific details are set forth in order to provide a thorough understanding of the present invention. However, those skilled in the art will understand that the present invention may be practiced without these specific details. In other instances, well known methods, procedures, components, and circuits have not been described in detail.

Figure 1:
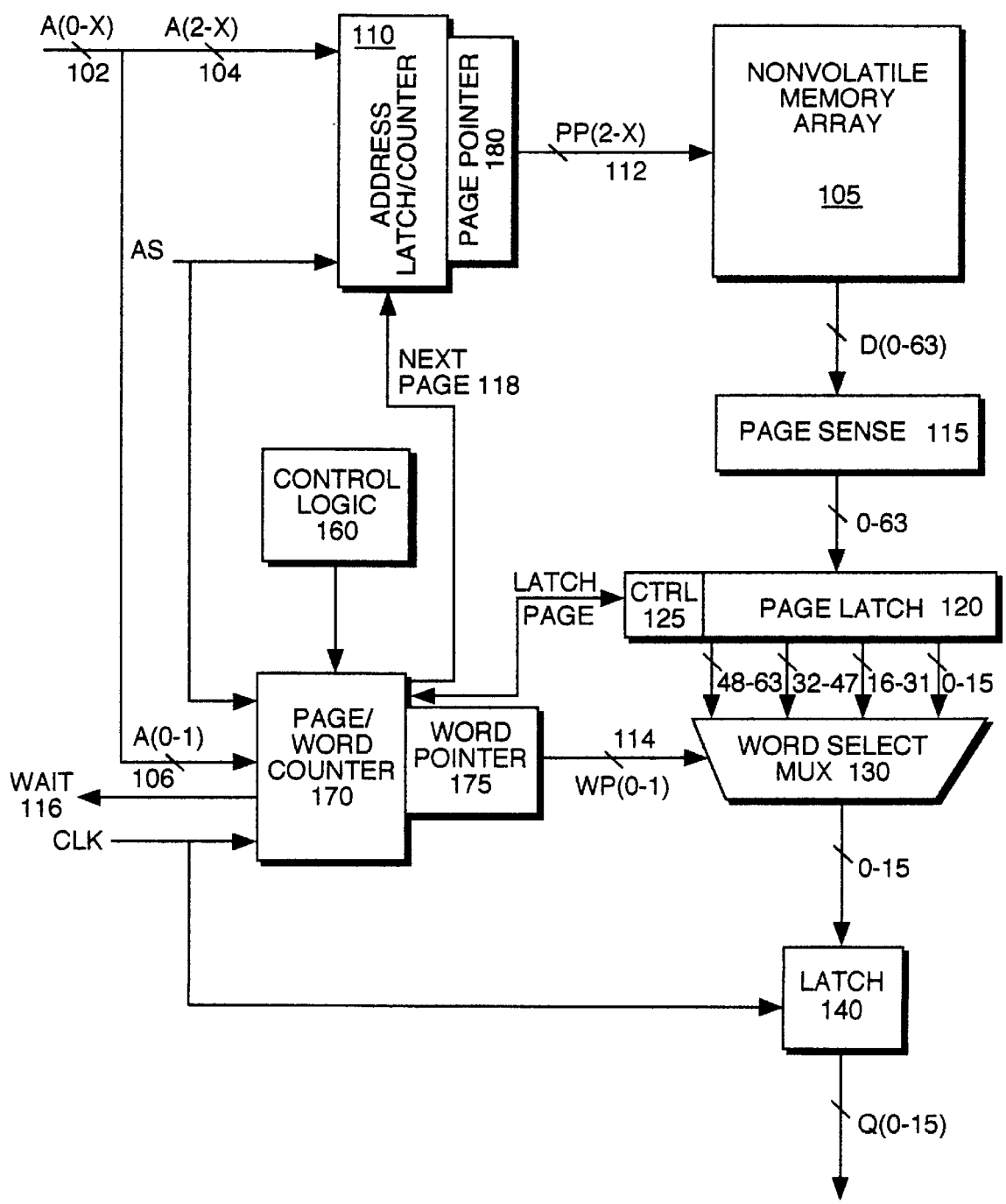
FIG. 1 is a block diagram of a nonvolatile memory device with a burst read memory interface.

System 100 of FIG. 1 is a block diagram of one embodiment of a nonvolatile memory device with a burst read interface. System 100 is configured to provide a stream of logically contiguous data from nonvolatile memory array 105. Words of data are read from nonvolatile memory array 105 one page at a time, wherein a page of data includes a plurality of words of data. After an initial number of wait states, words of data are synchronously read from nonvolatile memory array 105 without incurring additional wait states between pages of data.

System 100 includes nonvolatile memory array 105, address latch/counter 110, page sense 115, page latch 120, word select multiplexer (mux) 130, latch 140, control logic 160, and page/word counter 170 coupled as shown. In one embodiment, nonvolatile memory array 105 comprises flash memory.

Flash memory is organized into individually erasable blocks of single transistor memory cells. Cells of flash memory are not individually erasable, however. An entire block of cells must be erased together. This is because the sources of all the single transistor cells in a block of cells are electrically coupled. An entire block of cells is erased by providing a high voltage to the electrically coupled sources. After an erase operation, few, if any, electrons are stored on the floating gates of all the cells in the block. By convention, the erased state is a logical one. A logical zero is programmed, or written, to an individual cell by adding electrons to the floating gate. The charge cannot be removed, however, without performing the high voltage erase operation on the entire block of cells, which makes flash memory one-way writable. For example, an individual single bit cell can be written from logical one to logical zero by adding charge to the floating gate. In order to return the cell to logical one after it has been programmed with a logical zero, however, an erase operation must be performed on the entire block of cells.

Flash memory can also be configured to store more than one bit in a single cell. The magnitude of negative charge on the floating gate of a single transistor cell of flash memory depends on the number of electrons being stored. When this magnitude is sensed, it is compared to one or more voltage references to determine the value stored in the cell. For instance, a cell of flash configured to store a single bit of data can be sensed using a single voltage reference. If the magnitude of negative charge is above a particular level, by convention the cell stores a logical zero. If no electrons, or only a few electrons, are stored on the floating gate, a logical one is stored. If three voltage references are used to sense the cell, then four states (e.g. two bits) can be stored in the cell. In general, storing multiple bits (e.g. n bits) in a single cell requires the ability to differentiate between $2^n$ levels which in turn requires $2^{n-1}$ voltage references.

Structurally, a flash memory cell is similar to an erasable programmable read only memory (EPROM) cell. The flash memory cell, however, can also be electrically erased. The acronym EEPROM (electrically erasable programmable read only memory) typically refers to a nonvolatile memory having two transistor memory cells. The terms "flash memory" and "flash EEPROM" are intended to refer to the electrically erasable programmable read only memory that comprises single transistor memory cells.

In FIG. 1, system 100 receives an initial address from a host system (not shown) over address lines A(0–x) 102. The initial address identifies a word of data within a page of data stored in nonvolatile memory array 105. When address strobe (AS) goes low, a new address is presented to system 100. When AS goes high, system 100 latches the initial address from address lines A(0–x) 102. Each address identifies a 16 bit word stored in nonvolatile memory 105. The low order bits of the initial address, A(0–1) 106, are provided to page/word counter 170, and latched by word pointer 175. The high order bits of the initial address, A(2–x) 104, are provided to address latch/counter 110 and latched by page pointer 180. The high order bits stored in page pointer 180 are supplied to nonvolatile memory array 105 over lines PP(2–x) 112. Page pointer 180 points to a 64-bit page of four 16-bit words of data in nonvolatile memory array 105. The page of data includes the word of data indicated by the initial address.

A set time after page pointer 180 is provided to nonvolatile memory array 105, page sense 115 provides the page of data to page latch 120. The amount of time depends on the access latency for nonvolatile memory array 105. Word pointer 175 is coupled to the select lines of word select mux 130 over lines WP(0–1) 114. Since word pointer 175 is initially loaded with the low order address bits provided by the host system, word pointer 175 points to the word of data in the page of data indicated by the initial address. Thus, the initially indicated word of data is selected and provided on data lines (0–15) to latch 140.

The clock signal (CLK) is provided by the host system to page/word counter 170 and latch 140. From the time the initial address is strobed into system 100 to the time the initial word of data reaches latch 140, page/word counter 170 may assert a number of wait states 116 forcing the host system to wait until valid data is available. On the next clock cycle after the word of data has been provided to latch 140, however, the word of data is read out of latch 140 to output pins Q(0–15).

If the initial address is merely the first address in a burst read operation, system 100 continues to read addresses until instructed to stop by control logic 160. Control logic 160 can be a component in system 100, or it can represent a number of control signals provided to system 100 from the host system. In either case, control logic 160 configures system 100 to identify a last word of data in a burst read operation. For instance, control logic 160 can provide system 100 with a particular number of pages and/or words of data to read. In which case, system 100 counts the words as they are read and stops when the particular number of words is reached. Similarly, system 100 can be configured to read a fixed number of words in each burst read, wherein control logic 160 merely informs system 100 when to perform a burst read. Alternately, control logic 160 can provide the address of the last word in the burst read, wherein system 100 terminates the burst read when the last address is encountered. In yet another alternative, control logic 160 could control the burst read directly by providing start and terminate signals.

In order to continue the burst read operation, page/word counter 170 adjusts word pointer 175 in response to the clock signal. The adjustment depends on a burst read order provided by control logic 160 for words on the page of data. For instance, the burst read order can be sequential wherein addresses on a page are read from word zero to word three. Any number of burst read orders supported by the host system can also be used. Page/word counter 170 adjusts word pointer 175 by adding a positive or negative integer, depending on the burst read order. For instance, if the burst read order is sequential, page/work counter 170 will simply increment word pointer 175.

If the last word in the burst read order on the current page of data has not been read, word pointer 175 is adjusted to point to the next word on the current page of data. The next word of data is then selected by word select mux 130 and, on the next clock cycle, that word of data is read out of latch 140. The process is repeated until the last word on the page or the last word in the burst read operation is read out of latch 140. In this manner, a page of data is synchronously read out of system 100.

If the last word in the burst read order on the current page of data has been read, and it is not the last word in the burst read operation, word pointer 175 is reset. That is, word pointer 175 is adjusted to point to the first word in the burst read order. For example, if the burst read order is sequential, word pointer 175 is reset from three to zero.

While one page is being sequentially read, a next page is being sensed. As soon as control 125 recognizes that page latch 120 has latched valid data from page sense 115, or as soon as word pointer 175 is advanced from the initial address value, page/word counter 170 provides a next page signal 118 to address latch/counter 110. Address latch/counter 110 then advances page pointer 180 to point to a next page. A set time later, the next page of data is provided by page sense 115.

System 100 is configured so that it takes less time to sense a next page of data than it takes to synchronously read four words of data out of page latch 120. As a result, when page/word counter 170 recognizes that a last word in the burst read order for the current page has been clocked out of page latch 120, page/word counter 170 instructs control 125 to immediately latch in the next page of data. In other words, while a first page of data is being synchronously clocked out of page latch 120, a next page of data is sensed by page sense 115 so that the next page of data is ready and waiting to be latched. Since word pointer 175 is reset after the last word in the burst read order on the current page is read, a first word on the next page is indicated when the next page is latched. In this fashion, pages of data are synchronously read out of system 100 without incurring wait states between the pages.

An initial number of wait states may have been incurred for the first page of data, depending on the speed of the clock. A second number of wait states may also be incurred between the first and second pages of data if, for instance, the initial address pointed to a last word in the burst read order on the current page. In which case, system 100 may not have enough time to sense the next page of data before the current page of data is finished being read. No further wait states should be encountered in the burst read operation, however, after the second page of data is read.

Page/word counter 170 checks each address to see if it is the last word in the burst read operation or the last word in the burst read order on a page. If a last word on a page is encountered, page/word counter 170 instructs control 125 to latch a next page into page latch 120 as soon as the next page of data is available. If the next page of data is not ready to be latched, wait states may be incurred, as discussed above. Assuming the current page of data is not a first page of data, or assuming enough words were read on the first page of data to give system 100 time to sense the next page, the next page of data should be ready and waiting to be latched. In which case, no wait states will be incurred.

If a last word in a burst read is encountered, system 100 does not latch the next page of data. Instead, system 100 stops incrementing word pointer 175, and merely reads out the last word in the burst read.

The page size, word size, page pointer size, and word pointer size can be configured differently in other embodiments. For example, in one embodiment a page corresponds to an individually erasable block of nonvolatile memory, wherein the block is 128 bits comprising eight 16-bit words of data. A block size can be larger or smaller in alternate embodiments.

Figure 2:
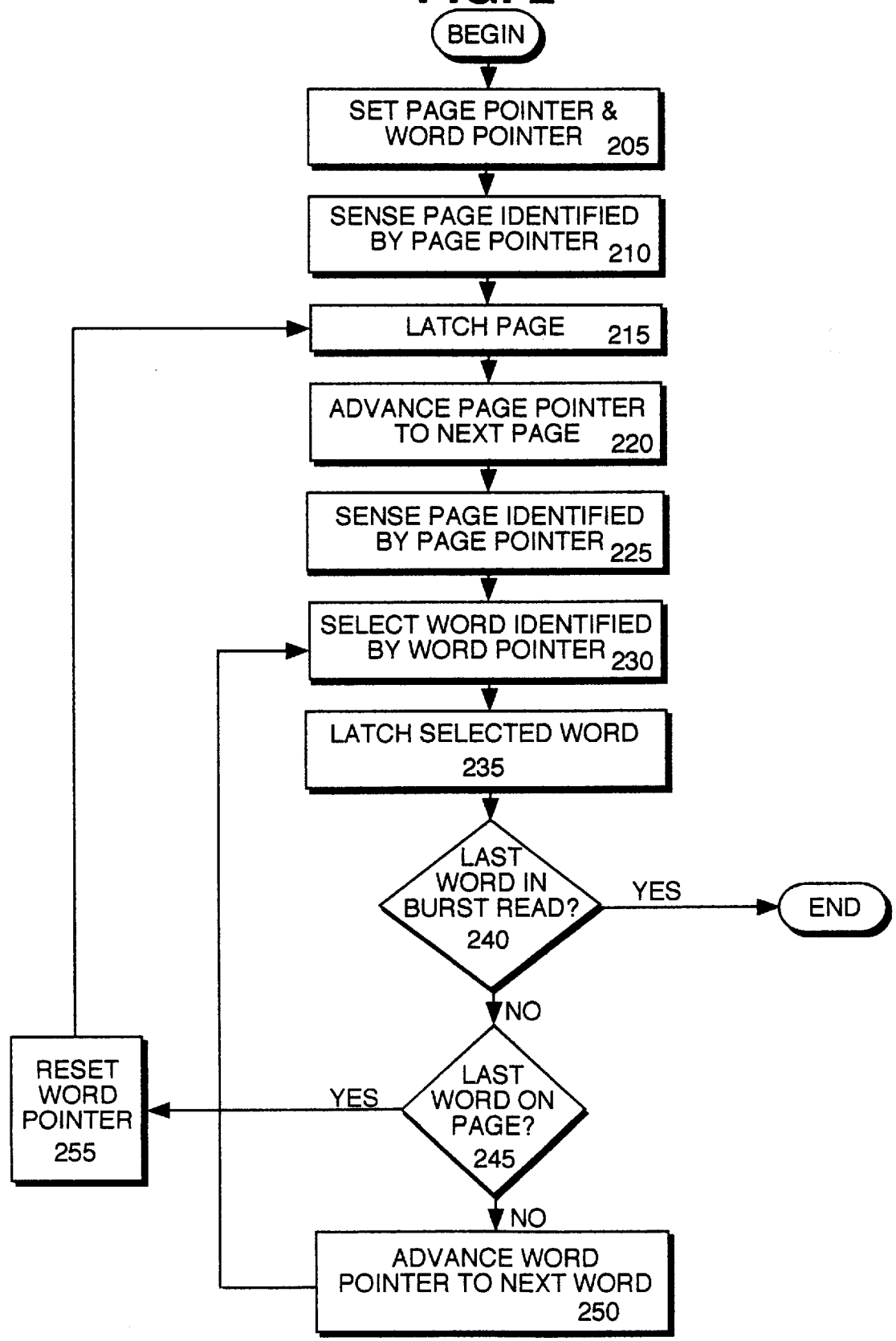
FIG. 2 is a flow chart of a burst read operation performed by the apparatus of FIG. 1.

FIG. 2 is a flow chart illustrating one embodiment of a burst read operation performed by the apparatus of FIG. 1. First, the initial address provided by the host system is used to set page pointer 180 and word pointer 175 in block 205. Page pointer 180 is used to sense a page of data from nonvolatile memory array 105 in block 210. In block 215, the page of data is latched by page latch 120 a set time later, depending on the access latency of nonvolatile memory array 105. Then, in block 220, page pointer 180 is advanced to identify a next page. The identified page is sensed in block 225. Concurrently, a word identified by word pointer 175 is selected in block 230. In block 235, the identified word is latched in latch 140. Page word/counter 170 checks for the last word in the burst read in block 240. If the last word has been read, the process ends. If the last word in the burst read has not been read, page/word counter 170 checks for the last word in the burst read order on the current page in block 245. If the last word on the page has not been read, word pointer 175 is advanced in block 250 to identify the next word. Flow returns to block 230 to select the next word. If the last word on the page has been read, word pointer 175 is reset in block 255, in order to point to the first word in the burst read order on the next page. Flow returns to block 215 to latch the next page of data. If enough time has passed since block 225, the next page will be ready and waiting to be latched. The process continues until the last word in the burst read is encountered. After an initial number of wait states, no additional wait states should be incurred between pages of data.

Figure 3:
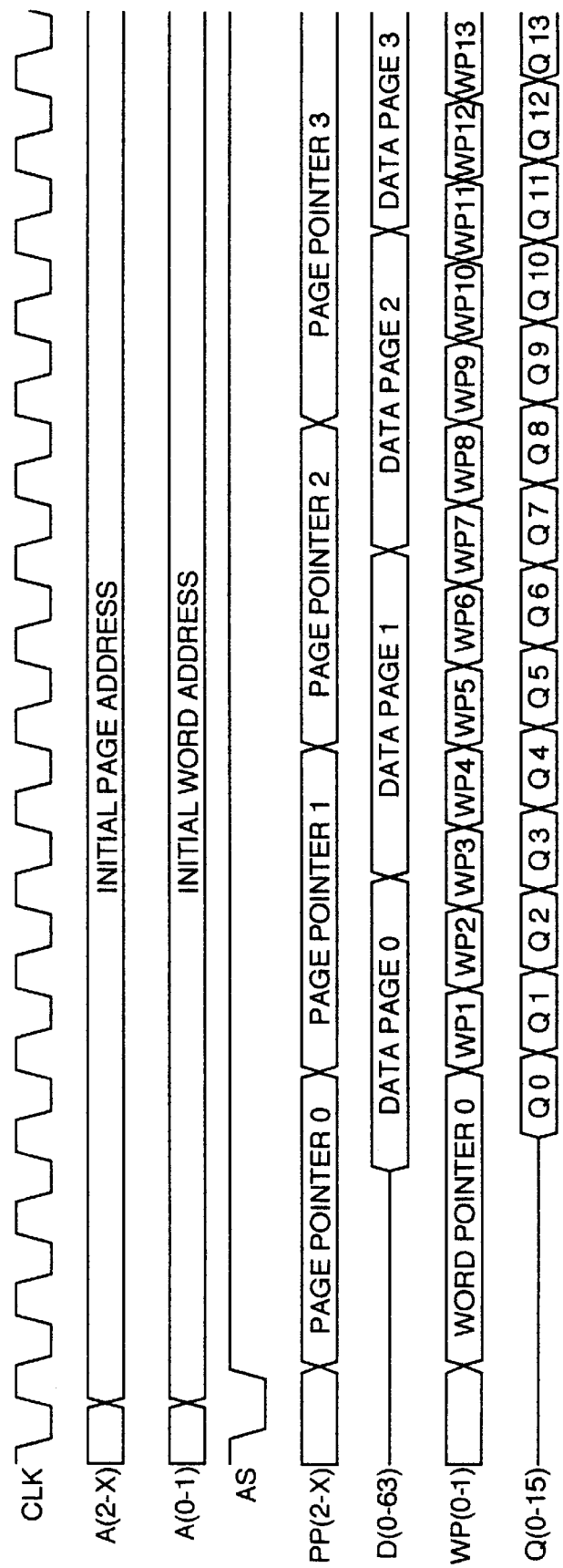
FIG. 3 is a timing diagram for one embodiment of the apparatus of FIG. 1.

FIG. 3 is a timing diagram illustrating the timing of a burst read operation by the apparatus of FIG. 1. An initial address is provided by the host system on address lines A(0–1) and A(2–x). Some time after address strobe (AS) is strobed low by the host system, page pointer 180 provides an initial page address, PAGE POINTER 0, on lines PP(2–x) 112, and word pointer 175 provides an initial word address, WORD POINTER 0, on lines WP(0–1) 114. A set time later, DATA PAGE 0 is provided from nonvolatile memory array 105 on lines D(0–63). DATA PAGE 0 is latched by page latch 120. WORD POINTER 0 is provided to word select mux 130 to select the word of data indicated by the initial address. During the next clock cycle after DATA PAGE 0 is available, the word of data, Q 0, is provided on output pins Q(0–15). In the illustrated example, three wait states were incurred from the time the initial address was provided.

Word pointer 175 is adjusted to WP1, indicating that valid data has been provided, which triggers page/word counter 170 to signal address latch/counter 110 to advance page pointer 180 to PAGE POINTER 1. In the depicted embodiment, the host system merely provides the initial address and the burst read order. System 100 provides the next page of addresses internally by incrementing page pointer 180 and adjusting word pointer 175.

A set time later, DATA PAGE 1 is provided on lines D(0–63). Meanwhile, words of data on DATA PAGE 0 are synchronously clocked to output pins Q(0–15). DATA PAGE 1 becomes available while the forth word of data, Q 3, is being read from page latch 120. DATA PAGE 1 is latched into page latch 120 immediately after the last word from the previous page of data is latched by latch 140. In this fashion, words of data are continuously clocked out without incurring wait states between pages of data.

In the illustrated embodiment, however, if the initial address pointed to any word on DATA PAGE 0 other than the first word in the burst read order on the page, one or more wait states would have been incurred between the first and second pages of data because the second page of data would not have been available at the time the last word of data was read from the first page.

Figure 4:
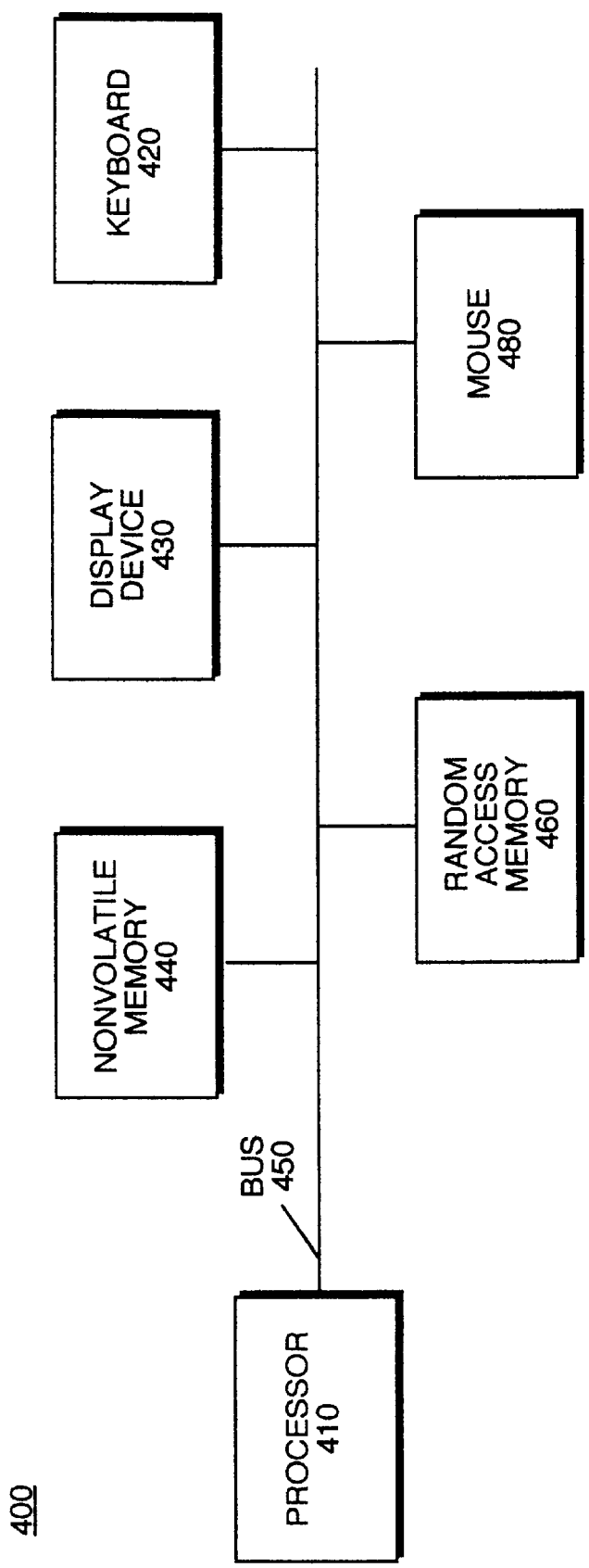
FIG. 4 is a block diagram of an example computer system in which the apparatus of FIG. 1 may be employed.

FIG. 4 is intended to represent a broad category of computer systems including, but not limited to, those based on the Pentium® processor, Pentium® Pro processor, or Pentium® II processor manufactured by and commonly available from Intel Corporation of Santa Clara, Calif., or the Alpha® processor manufactured by Digital Equipment Corporation of Maynard, Mass. In FIG. 4, processor 410 includes one or more microprocessors. Processor 410 is coupled to nonvolatile memory 440 and random access memory 460 by bus 450. Input/Output devices, including display device 430, keyboard 420, and mouse 480, are also coupled to bus 450. A number of additional components can be directly or indirectly coupled to bus 450 including, but not limited to, a bus bridge to another bus, an internet interface, additional audio/video interfaces, additional memory units, and additional processor units. Some or all of the components can be eliminated, rearranged, or combined.

In one example, nonvolatile memory 440 is incorporated with the teachings of system 100, as depicted in FIG. 1. A burst read order, an initial address, an address strobe signal, and a clock signal are all provided by processor 410. In this fashion, processor 410 initiates a burst read operation from nonvolatile memory 440 without incurring wait states after an initial number of wait states.

In another example, nonvolatile memory 440 is incorporated with the functionality of nonvolatile memory array 105, page sense 115, page latch 120, word select mux 130, and latch 140. The functionality of address latch/counter 110, control logic 160, control 125, page/word counter 170, and word pointer 175 are executed by processor 410 as a series or sequence of instructions or function calls. Alternately, one or more ASICs (application specific integrated circuits) are endowed with this functionality, and inserted into system 400 as a separate component, or combined with another component.

System 100 can be used in a wide variety of burst read implementations including, but not limited to, downloading an image from a digital camera, downloading BIOS (Basic Input/Output System), downloading voice/music audio data, and downloading network files. The present invention can also be beneficially used to improve burst code execution from flash memory. The teachings of the present invention are not limited to flash memory, and can be employed with a variety of nonvolatile and volatile memory devices.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:

sensing a first page as a current page of data from a memory, wherein a page contains a plurality of words of data;

latching the current page of data;

synchronously reading the current page of data; and initiating sensing of a next page of data before reading a second word on the current page.

2. The method of claim 1, wherein sensing a first page as a current page includes indicating the current page of data to sense by a page pointer, and synchronously reading the current page includes indicating one of the plurality of words on the current page of data to read by a word pointer.

3. The method of claim 2, wherein sensing a first page as a current page includes the page pointer initially corresponding to N high order bits of an address of a first word of data, and synchronously reading the current page includes the word pointer initially corresponding to M low order bits of the address of the first word of data.

4. The method of claim 2, wherein synchronously reading the current page comprises:

selecting the word indicated by the word pointer;

adjusting the word pointer to indicate a next word;

repeating selecting the word indicated by the word pointer, and adjusting the word pointer to indicate a next word, until a last word on the current page is detected.

5. The method of claim 1, wherein synchronously reading the current page comprises reading the words in one of a sequential order and a non-sequential order.

6. The method of claim 1, further comprising repeating latching the current page of data, synchronously reading the current page of data, and initiating the sensing of a next page of data before reading a second word on the current page, until a last word of data is read.

7. The method of claim 1, further comprising: latching the next page of data as the current page after reading the last word of the current page of data.

8. The method of claim 1, wherein the memory comprises a flash electrically erasable programmable read only memory (EEPROM).

9. An apparatus comprising:

a memory; and a reading device, coupled to the memory, to sense a first page as a current page of data from the memory, wherein a page comprises a plurality of words of data, latch the current page of data, synchronously read the current page of data, and initiate sensing of a next page of data before reading a second word on the current page.

10. The apparatus of claim 9, wherein the reading device comprises:

an address latch/counter, coupled to the memory, to latch a page pointer, wherein the page pointer indicates the current page to sense;

a plurality of sense amplifiers, coupled to the memory, to sense the current page of data;

a data latch, coupled to the plurality of sense amplifiers, to latch the current page of data;

a multiplexer, coupled to the data latch, to select a word of data to output from the current page of data;

a page/word counter, coupled to the address latch/counter, data latch, and multiplexer to adjust the page pointer, indicate when to latch the current page of data, and latch and adjust a word pointer, wherein the word pointer indicates one of the plurality of words to read; and a control logic, coupled to the page/word counter, to control operation of the page/word counter.

11. The apparatus of claim 10, wherein the page pointer initially corresponds to N high order bits of an address of a first word of data, and the word pointer initially corresponds to M low order bits of the address of the first word of data.

12. The apparatus of claim 10, wherein the reading device selects the word indicated by the word pointer, adjusts the word pointer to indicate a next word, and repeats the selecting and adjusting until a last word on the current page is detected by the reading device.

13. The apparatus of claim 9, wherein the reading device reads the words in one of a sequential order and a non-sequential order.

14. The apparatus of claim 9, wherein the reading device reads data from pages until a last word of data is read.

15. The apparatus of claim 9, wherein the reading device latches the next page of data as the current page after reading the last word of the current page.

16. The apparatus of claim 9, wherein the memory is a flash electrically erasable programmable read only memory.

17. A machine-readable storage medium having stored therein a plurality of programming instructions, designed to be executed by a processor, wherein the plurality of programming instructions implements the method of:

sensing a first page as a current page of data from a memory, wherein a page contains a plurality of words of data;

latching the current page of data in a data latch;

synchronously reading the current page of data from the data latch; and initiating the sensing of a next page of data before reading a second word on the current page.

18. A computer system comprising:

a bus;

a processor, coupled to the bus; and a memory device, coupled to the bus, including a memory, and a reading device, coupled to the memory, to sense a first page as a current page of data from the memory, a page of data comprising a plurality of words of data, latch the current page of data, synchronously read the current page of data, and initiate sensing of a next page of data before reading a second word on the current page.

19. The machine-readable storage medium of claim 17, wherein sensing a first page as a current page includes indicating the current page of data to sense by a page pointer, and synchronously reading the current page includes indicating one of the plurality of words on the current page of data to read by a word pointer.

20. The machine-readable storage medium of claim 17, wherein sensing a first page as a current page includes the page pointer initially corresponding to N high order bits of an address of a first word of data, and synchronously reading the current page includes the word pointer initially corresponding to M low order bits of the address of the first word of data.

21. The machine-readable storage medium of claim 17, wherein synchronously reading the current page comprises:

selecting the word indicated by the word pointer;

adjusting the word pointer to indicate a next word;

repeating selecting the word indicated by the word pointer, and adjusting the word pointer to indicate a next word, until a last word on the current page is detected.

22. The machine-readable storage medium of claim 17, wherein synchronously reading the current page comprises reading the words in one of a sequential order and a non-sequential order.

23. The machine-readable storage medium of claim 17, the method further comprising repeating latching the current page of data, synchronously reading the current page of data, and initiating the sensing of a next page of data before reading a second word on the current page, until a last word of data is read.

24. The machine-readable storage medium of claim 17, the method further comprising:

latching the next page of data as the current page after reading the last word of the current page of data.

25. The machine-readable storage medium of claim 17, wherein the memory comprises a flash electrically erasable programmable read only memory (EEPROM).

26. The computer system of claim 18, wherein the reading device comprises:

an address latch/counter, coupled to the memory, to latch a page pointer, wherein the page pointer indicates the current page to sense;

a plurality of sense amplifiers, coupled to the memory, to sense the current page of data;

a data latch, coupled to the plurality of sense amplifiers, to latch the current page of data;

a multiplexer, coupled to the data latch, to select a word of data to output from the current page of data;

a page/word counter, coupled to the address latch/counter, data latch, and multiplexer to adjust the page pointer, indicate when to latch the current page of data, and latch and adjust a word pointer, wherein the word pointer indicates one of the plurality of words to read; and a control logic, coupled to the page/word counter, to control operation of the page/word counter.

27. The computer system of claim 18, wherein the reading device selects the word indicated by the word pointer, adjusts the word pointer to indicate a next word, and repeats the selecting and adjusting until a last word on the current page is detected by the reading device.

28. The computer system of claim 18, wherein the reading device reads the words in one of a sequential order and a non-sequential order.

29. The computer system of claim 18, wherein the reading device reads data from pages until a last word of data is read.

30. The computer system of claim 18, wherein the reading device latches the next page of data as the current page after reading the last word of the current page.

* * * * *